United States Patent [19]
Yamamoto

[11] Patent Number: 5,815,095
[45] Date of Patent: Sep. 29, 1998

[54] SURVEYING INSTRUMENT

[75] Inventor: Kiyoshi Yamamoto, Tokyo, Japan

[73] Assignee: Asahi Kogaku Kogyo Kabushiki Kaisha, Tokyo, Japan

[21] Appl. No.: 629,579

[22] Filed: Apr. 9, 1996

[30] Foreign Application Priority Data

Apr. 10, 1995 [JP] Japan ................................. 7-084363

[51] Int. Cl.[6] .......................... H03K 17/94; H03M 11/00
[52] U.S. Cl. .............................. 341/22; 341/23; 364/561; 356/3; 345/357
[58] Field of Search ................................. 341/20, 22, 23; 364/561; 356/3; 345/333, 354, 357

[56] References Cited

U.S. PATENT DOCUMENTS

| | | | |
|---|---|---|---|
| 4,113,381 | 9/1978 | Epstein | 356/152 |
| 4,346,989 | 8/1982 | Gort et al. | 356/152 |
| 4,702,008 | 10/1987 | Suzuki et al. | |
| 5,051,934 | 9/1991 | Wiklund | 364/561 |
| 5,216,480 | 6/1993 | Kaneko et al. | 356/152 |
| 5,650,949 | 7/1997 | Kishimoto | 364/561 |

*Primary Examiner*—Michael Horabik
*Assistant Examiner*—Timothy Edwards, Jr.
*Attorney, Agent, or Firm*—Kane, Dalsimer, Sullivan, Kurucz, Levy, Eisele and Richard, LLP

[57] ABSTRACT

A surveying instrument including an operating portion having a number of keys including specific keys which are assigned specific functions, an indicator which produces an indication corresponding to the specific keys, an indication mode switching device which changes the indication from a first indication mode to a second indication mode when one specific key is actuated once, and a controller which performs the specific function only when the associated key is actuated in accordance with a predetermined operation pattern during the indication of the function at the second indication mode.

13 Claims, 7 Drawing Sheets

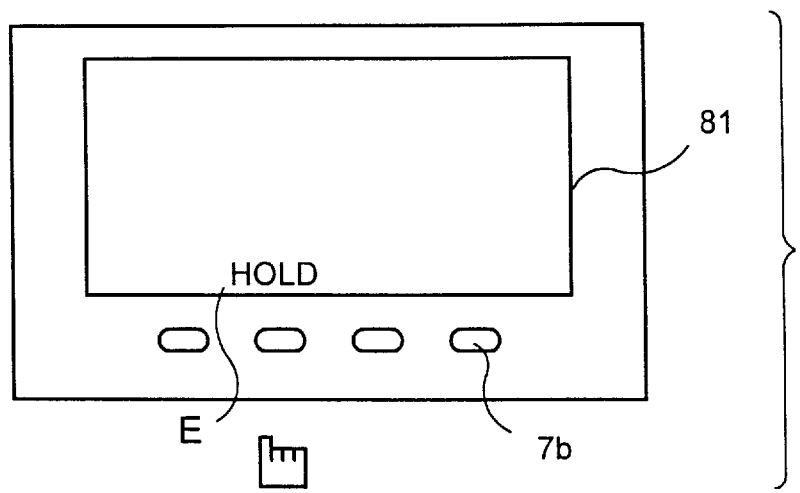
F I G. 6a
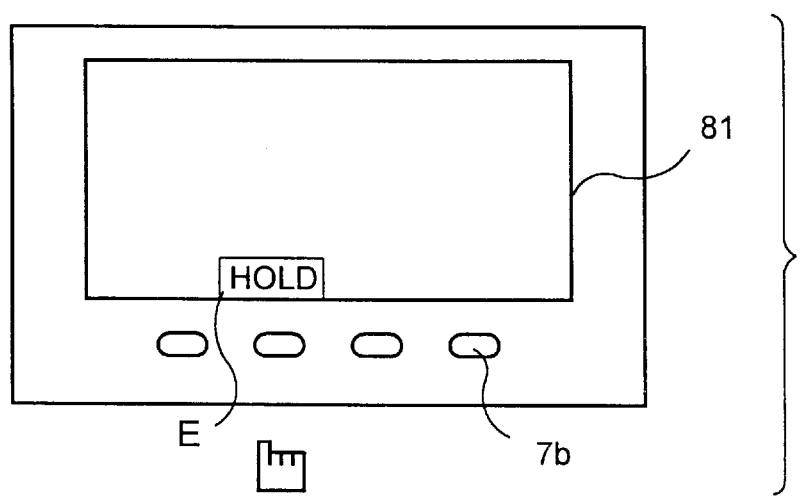
F I G. 6b
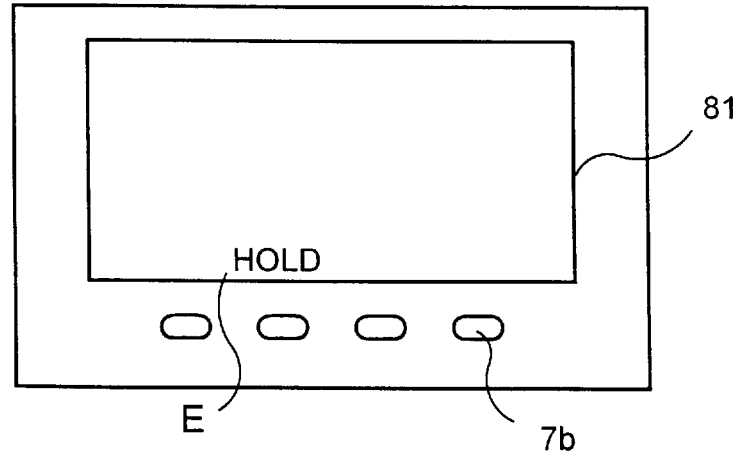
F I G. 6c

SURVEYING INSTRUMENT

BACKGROUND OF THE INVENTION

1. Field of the Invention

The present invention relates to a surveying instrument having input keys and a display, such as a distance meter or an angle meter.

2. Description of Related Art

Distance measuring instruments, such as optical distance meters or angle measuring meters (e.g. an electronic theodolite), have been adapted to be used as surveying instruments to measure a distance or altitude of a tract of land. In the case of the distance meter, it is adapted to measure a distance between a specific reference point and a point to be measured. While the angle meter is adapted to measure the direction of the point to be measured, based on horizontal and vertical angles with respect to a specific reference point.

Recently, a total surveying station having a distance meter and an angle meter in combination, and a computer (data processors) which processes measurement data thereof has been widely used.

Surveying instruments are provided with a large number of input keys to input commands during various operations, for example a data processing operation. The input keys are assigned functions corresponding to modes of operation set in the surveying instrument. The surveying instrument includes an MPU (Micro Processor Unit) which judges and performs the functions assigned to the respective input keys when the latter are actuated.

In the case that the functions assigned to the input keys are fundamental and extremely important survey functions, if a wrong key is depressed by mistake, serious erroneous measurements would occur.

In order to provide a fail-safe way of pressing the correct keys in a known surveying instrument the significant functions are performed only when the associated input keys are actuated in accordance with a predetermined operation pattern. For instance, in a conventional surveying instrument, the function to set an origin ("0-set" function) in a measuring operation of the horizontal angle, or the function to hold the indication of the measured horizontal angle ("HOLD" function), are performed only when the input key(s) associated with the 0-set function or the hold function is (are) depressed twice consecutively within a predetermined period of time. However, with this solution there is a possibility that an operator only depresses the input key once and forgets to depress the input key a second time and consequently, the intended operation is not performed. To eliminate this possibility a known surveying instrument emits a buzzing sound for a predetermined period of time when the input key, which is assigned a function that is performed after two consecutive depressions of the input key within a predetermined time, is depressed only once. The buzzing sound warns the operator that the input key should be depressed a second time. Also, due to the buzzing sound, the operator can know the period of time in which the intended operation can still be performed by the second depression of the input key.

However, since surveying instruments are generally used in noisy environments it is difficult for an operator to hear the buzzing sound. Moreover, there is a social need to provide a surveying instrument that even an operator who suffers from a hearing impairment or hearing loss can use.

SUMMARY OF THE INVENTION

The primary object of the present invention is to provide a surveying instrument in which when an input key which must be actuated in accordance with a predetermined input operation pattern is actuated, a need for a subsequent (second) operation of the input key is visually indicated.

To achieve the object mentioned above, according to the present invention, there is provided a surveying instrument comprising an operating portion having a number of keys. The keys include at least one specific key which is assigned a specific function. An indicating means is provided for producing an indication corresponding to the specific key. When the specific key is actuated once, an indication mode switching means changes the indication from a first indication mode to a second indication mode. When the specific key is actuated in accordance with a predetermined operation pattern during the indication of the function at the second indication mode, a function performing means performs the specific function.

According to another aspect of the present invention, there is provided a surveying instrument comprising at least one key which is assigned a specific function and an indicating means for producing an indication corresponding to the key. An indication mode switching means is also provided for switching the indication from a first indication mode to a second indication mode when the key is actuated once, and a function performing means for performing the function only when the second operation of the key occurs during the indication of the function at the second indication mode.

The present disclosure relates to subject matter contained in Japanese Patent Application No. 07-84363 (filed on Apr. 10, 1995) which is expressly incorporated herein by reference in its entirety.

BRIEF DESCRIPTION OF THE DRAWINGS

The invention will be described below in detail with reference to the accompanying drawings, in which.

DESCRIPTION OF THE PREFERRED EMBODIMENT

Figure 1:
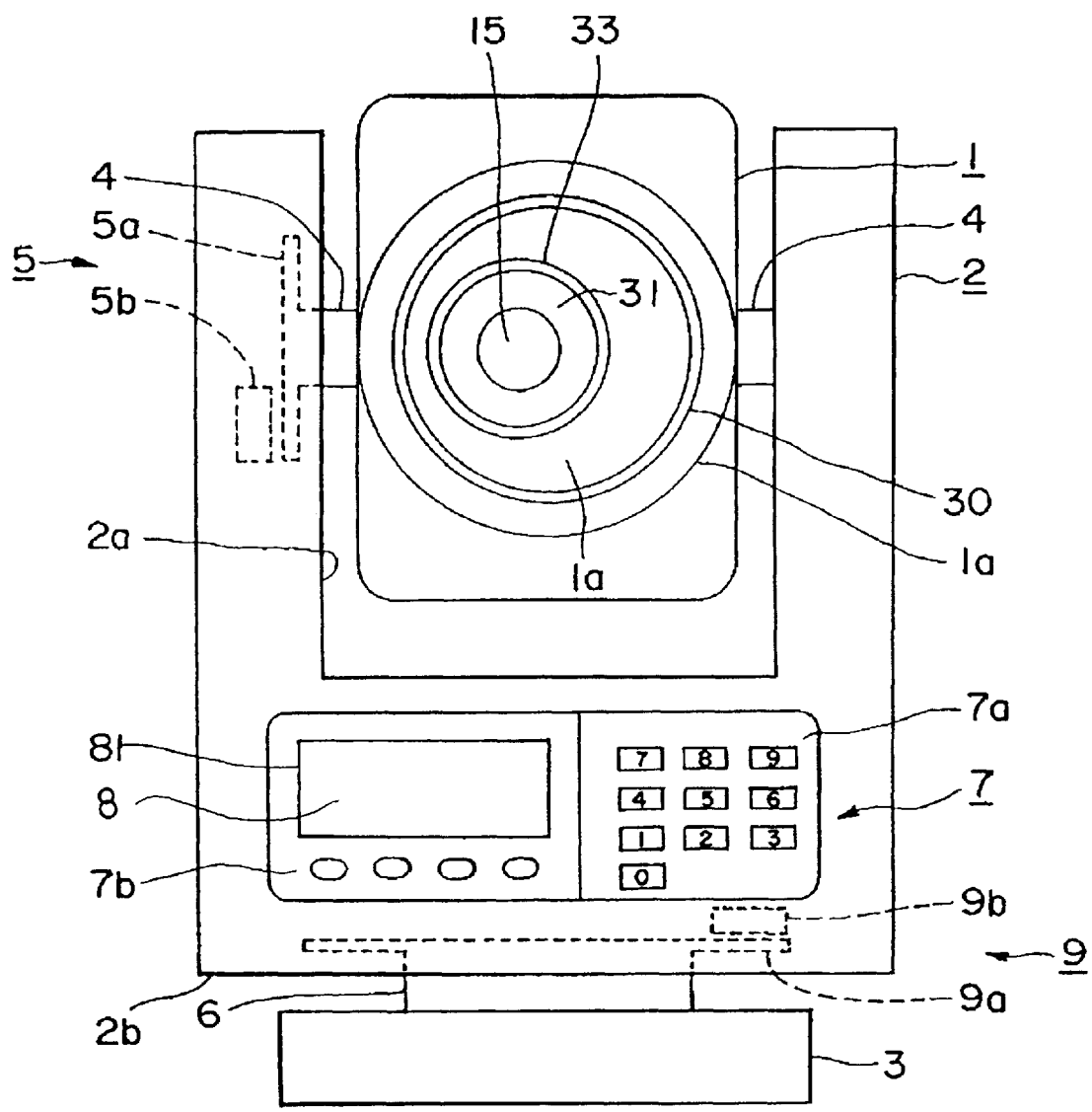
FIG. 1 is a front elevational view of a first embodiment of a surveying instrument according to the present invention.

The basic constituent features of the present invention will be firstly discussed below.

(Surveying Instrument)

The present invention is applicable to any type of surveying instrument, such as a distance or angle meter, in which operations are performed when input keys are actuated. In the case of the distance meter, the present invention can be applied to an optical distance meter. The present invention can be also applied to a theodolite, such as an electronic theodolite or a transit theodolite, in the case of an angle meter. Moreover, the present invention can be equally applied to a total surveying station having the functions of an optical distance meter and an electronic theodolite.

(Key)

The term "key" includes a switch, such as a button, or a touch panel. In case of a touch panel, a transparent touch panel is provided on a display (indicating means), so that the portions of the touch panel on the display, corresponding to the respective functions display, can be used as input keys.

(Indication)

An indication corresponding to the keys could be in the form of letters indicating the functions assigned to the keys, or in the form of symbols representing the functions. Moreover, the indication could be the keys themselves, or numerals, letters, or symbols that are made in advance according to the functions.

(Mode of Indication)

Indication modes, i.e., a first indication mode and a second indication mode, are not limited to specific types, so long as they can be visually distinguished. For example, the second indication mode (black-white image) could be an inversion of the first indication mode (white-black image). Alternatively, the second indication mode can be obtained by flickering the indication of the first indication mode. Furthermore, the first and second indication modes can be colored differently or can have different contrasts or shapes.

(Indication Mode Switching Means)

It is possible for an indication mode switching means to automatically return the second indication mode to the first indication mode at a predetermined time after the change from the first indication mode to the second indication mode. Consequently, the operator knows the period of time in which the intended operation can still be performed by the second depression of the input key or by a predetermined pattern of input operation.

The indication mode switching means may change the second indication mode to the first indication mode when the function performing means performs the intended function. Consequently, the operator can learn that no operation can be performed by only a single depression of the input key in a subsequent operation.

(Predetermined Input Pattern)

A predetermined input pattern could be comprised of three or more consecutive operations of the same input key or consecutive operations of different input keys.

The following discussion will be addressed to a first embodiment of the present invention, in which an indicator (display) of the surveying instrument is applied to a total surveying station.

(Body of Total Surveying Station)

FIG. 1 shows a front elevational view of a total surveying station (viewed from an eyepiece side), which is essentially comprised of a collimating telescopic portion 1, a body portion 2 and a base portion 3.

As viewed in FIG. 1, the body portion 2 has a substantially U-shaped recess 2a and is provided with an LCD (Liquid Crystal Display) panel 81 having an indicating portion 8 and an operation portion 7 having a number of input keys. The input keys are essentially grouped into numeral keys 7a and function keys 7b. The numeral keys 7a are adapted to input numerical data necessary for surveying. The function keys 7b are assigned respective functions (e.g., distance measuring mode, initialization mode, angle measuring mode, correction mode, etc.) set in the total surveying station. The functions assigned to the function keys 7b are indicated on the portion of the LCD panel 81 above the respective function keys 7b (as viewed in FIG. 1). Among the functions assigned to the function keys 7b, some are performed only when two consecutive depressions of the same function key are carried out within a predetermined time. They are, for example, a "0-set" function (FIG. 5) to set the origin (reference direction) for the measurement of the horizontal angle in the angle measuring mode, and a "HOLD" function (FIG. 6) to hold and store the indication of the measured horizontal angle in a memory.

The collimating telescopic portion 1 has a generally prism shape contour corresponding to the generally U-shaped recess 2a of the body portion 2, and extends in an optical axis direction (perpendicular to the sheet of the drawing) in the recess 2a. The collimating telescopic portion 1 is provided therein with a collimating telescope (not shown) which adjusts the line of sight with respect to an object whose angle is to be measured, also provided is a stationary lens barrel 1a, a focusing dial 30, a diopter adjusting dial 33 and an eyepiece system 15.

An objective lens (not shown) of the collimating telescope also serves as a light transmitter which transmits modulated light to optically measure a distance, and a light receiver which receives the return light reflected by a corner-cube prism located at a point to be surveyed. Consequently, the collimating telescope can be used to adjust the line of sight with respect to the object whose distance is to be measured (if both the angle and the distance are simultaneously measured, the corner-cube prism is an object to be collimated).

The collimating telescopic portion 1 is supported by a lateral shaft 4 in the generally U-shaped recess 2a of the body portion 2 to rotate about an axis of the lateral shaft 4. The lateral shaft 4 is provided on one end thereof with a transparent scale 5a secured thereto. The transparent scale 5a is in the form of a circular disc. The body portion 2 has a detector 5b incorporated therein, which detects a pattern formed on the transparent scale 5a. The transparent scale 5a and the detector 5b constitute an increment type vertical encoder 5 which generates pulses, the number of which corresponds to the relative rotation angle between the collimating telescopic portion 1 and the body portion 2. The pulses represent the direction of the relative rotation therebetween.

The base portion 3, which is in the form of a circular cylinder, is supported by a vertical shaft 6 (perpendicular to the lateral shaft 4) at a bottom 2b of the body portion 2, to rotate about a vertical axis of the vertical shaft 6. The vertical shaft 6 is provided on one end thereof with a transparent scale 9a secured thereto. The transparent scale 9a is in the form of a circular disc. The body portion 2 includes therein a detector 9b which detects a pattern formed on the transparent scale 9a. The transparent scale 9a and the detector 9b constitute an increment type horizontal encoder 9 which generates pulses whose number corresponds to the relative rotation angle between the base portion 3 and the body portion 2. The pulses represent the direction of the relative rotation therebetween.

As constructed above, the collimating telescopic portion 1 can be oriented in any direction with respect to the base portion 3 which is secured to the ground. The direction of the collimating telescope is detected in accordance with the pulses generated by the vertical encoder 5 and the horizontal encoder 9.

(Internal Circuit of the Total Surveying Station)

Figure 2A:
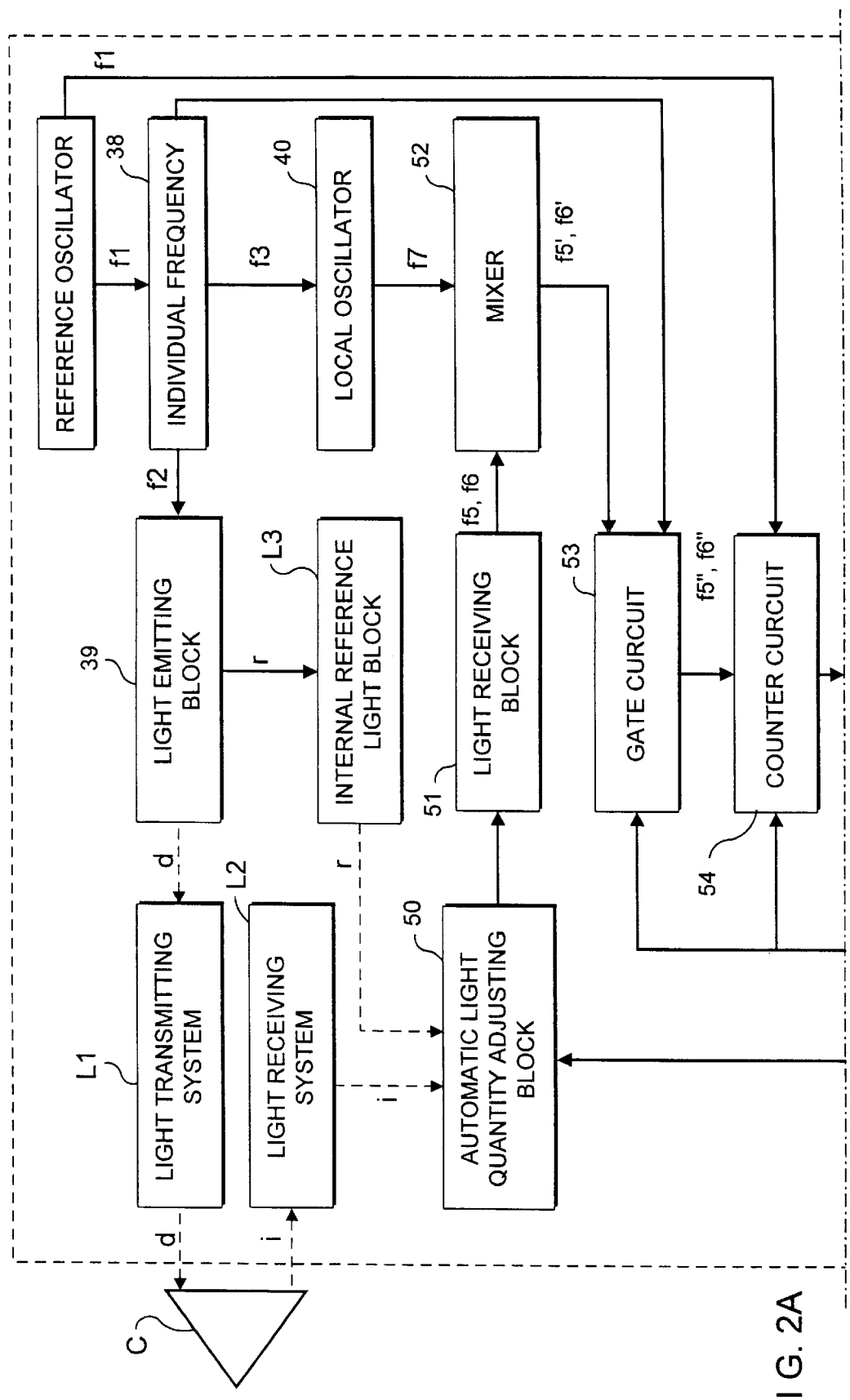
FIG. 2 (comprising FIGS. 2A and 2B) is a block diagram of an internal circuit of the surveying instrument shown in FIG. 1.
Figure 2B:
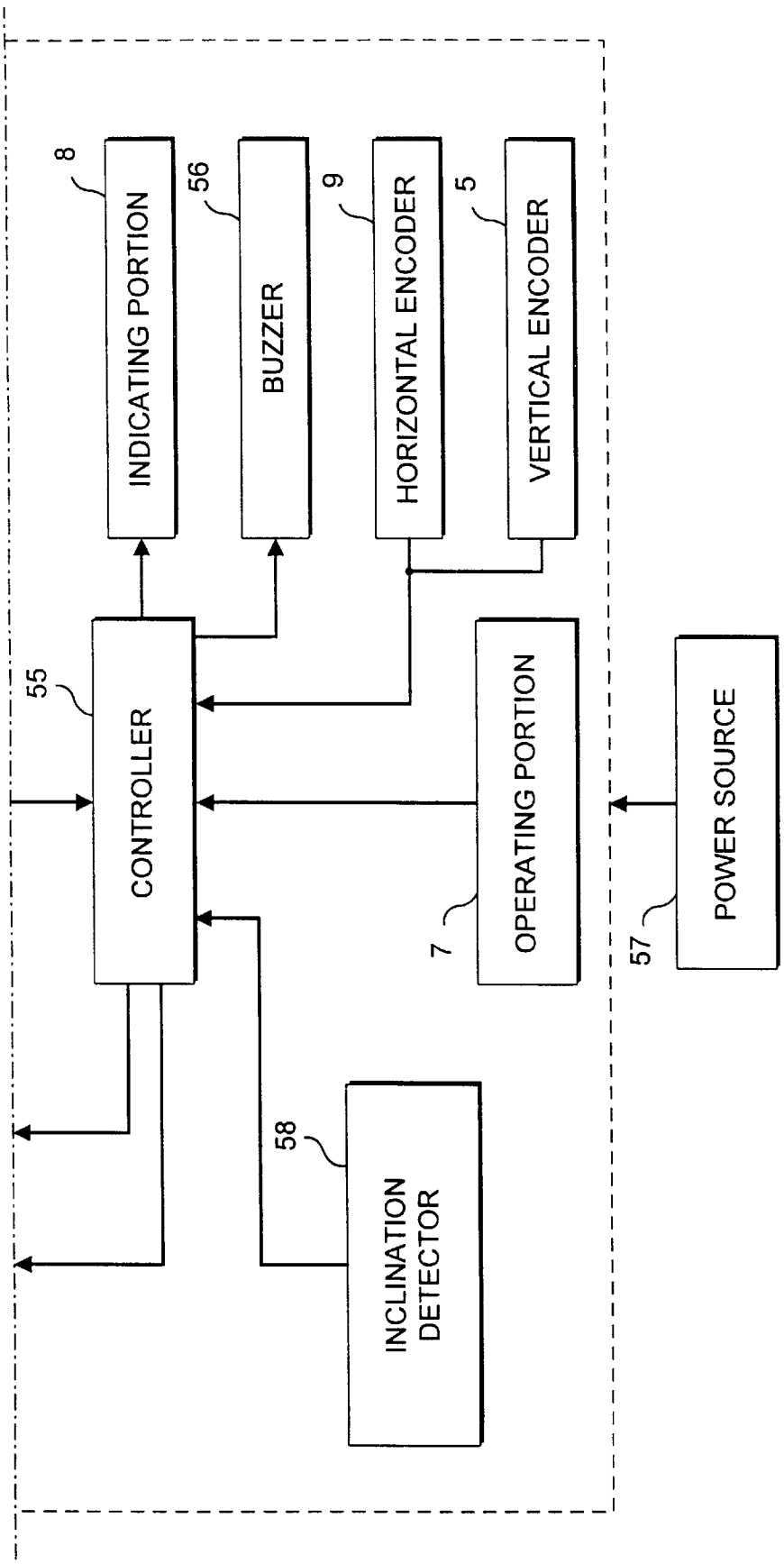

FIG. 2 shows a block diagram of an internal circuit of the total surveying station. In FIG. 2, reference numeral 57 denotes an electrical power source which supplies the total surveying station with electrical power.

A reference oscillator 37, in the form of a quartz oscillator, generates a reference frequency signal f1 in accordance with a distance measurement. The reference frequency signal f1 is input to an individual frequency signal generator 38 and a counter circuit 54.

The individual frequency signal generator 38 divides the reference frequency signal f1 to produce individual (separate) frequency signals to be used in the total surveying station. Namely, the individual frequency signal generator 38 generates a modulation signal f2 which is supplied to a light emitting block 39 to modulate the intensity of the distance measuring light, a reference signal f3 which is supplied to a local oscillator 40, and a comparative reference signal f4 which is used to determine a phase difference in a gate circuit 53. The frequency signals f2, f3, f4 are produced so that the initial phases thereof are synchronized. The comparative reference signal f4 is obtained by dividing the modulation signal f2.

The light emitting block 39 includes a light emitting diode (LED) which emits light whose intensity has been modulated in accordance with the modulation signal f2. The light emitting block 39 alternately emits incident light d upon an optical light transmitting system L1 and internal reference light r upon an internal reference light block L3.

The light d emitted from the light emitting block 39 is made incident upon a corner-cube prism C along the optical axis of the collimating telescope through the optical light transmitting system L1. A light receiving system L2 receives return light i reflected from the corner-cube prism C along the optical axis of the collimating telescope and converges the return light i upon an automatic light quantity adjusting block 50.

The internal reference light r, emitted from the light emitting block 39, is relayed by the internal reference light block L3 and is made incident upon the automatic light quantity adjusting block 50. The automatic light quantity adjusting block 50 automatically adjusts the quantity of the return light i from the light receiving system L2 and the internal reference light r from the internal reference light block L3, so that the quantity of light passing therethrough can always be kept constant, regardless of the distance from the corner-cube prism C.

A light receiving block 51 includes a photodiode (not shown) which receives the return light i whose quantity has been adjusted by the automatic light quantity adjusting block 50, and the internal reference light r, the quantity of which has been adjusted by the automatic light quantity adjusting block 50. The light receiving block 51 converts the return light i and the internal reference light r into a modulated return light signal f5 and a modulated reference light signal f6, respectively. The modulated return light signal f5 and the modulated reference light signal f6 are sent to a mixing circuit (mixer) 52.

The local oscillator 40 generates a signal f7 whose frequency is slightly different from that of the modulation signal f2 and sends the same to the mixing circuit 52. The mixing circuit 52 mixes the modulated return light signal f5, the modulated reference light signal f6, and the signal f7, so that only modulated return light signal f5' and modulated reference light signal f6', having a frequency of (f7−f2), are extracted from the signals obtained by the mixing by a low-pass filter (not shown). The modulated return light signal f5' and the modulated reference light signal f7', that have been beaten-down to a few kHZ by the mixing circuit 52 are sent to the gate circuit 53.

The gate circuit 53 produces a signal f5" corresponding to a difference in phase (i.e., a digital signal "H" for the time corresponding to the phase difference) between the comparative reference signal f4 issued from the individual frequency signal generator 38 and the modulated return light signal f5' issued from the mixer 52. Similarly, the gate circuit 53 produces a signal f6" corresponding to a difference in phase (i.e., a digital signal "H" for the time corresponding to the phase difference) between the comparative reference signal f4 issued from the individual frequency signal generator 38 and the modulated reference light signal f6' issued from the mixing circuit 52. The comparative reference signal f4 (produced in advance), has the same frequency as the signals f5' and f6' which are produced by the beating-down operation by the mixing circuit 52.

The counter circuit 54 counts the length of the signals f5" and f6" (period of time for which the signal level is "H") issued from the gate circuit 53. In the counting operation, the reference frequency signal f1 from the reference oscillator 37 is used as counted pulses, namely, the number of reference frequency signals f1 received when the signals f5" and f6" are at level "H" is counted. The value counted, which corresponds to the phase difference of the modulated return light signal f5 or the modulated reference light signal f6, is supplied to a controller 55.

The vertical (direction) encoder 5 sends pulses corresponding to the relative angle between the body portion 2 and the collimating telescopic portion 1 to the controller 55. The vertical encoder 5 is provided with an origin set therein at which the reference pulses are issued when the collimating telescopic portion 1 is parallel with a predetermined horizontal reference plane set for the body portion 2. The horizontal (direction) encoder 9 sends pulses corresponding to the relative angle between the body portion 2 and the base portion 3 to the controller 55. There is no origin set in the horizontal encoder 9 to produce the reference pulses.

The operating portion 7 sends instructions to measure the angle, distance, temperature, atmospheric pressure data or a prism constant for a weather correction, to the controller 55. Commands are also input to the controller 55 to process data in accordance with the measured distance or angle data. An angle detector (inclination detector) 58 detects a deviation (inclination angle) of the actual direction from the horizontal reference plane (altitude origin).

The controller 55, as a function performing means, generally controls the gate circuit 53, the counter 54, the automatic light quantity adjusting block 50, and other circuits. The controller 55 calculates the distance between the center of the total surveying station (a position on the optical axis of the collimating telescope optically equivalent to the light emitting block 39 and the light receiving block 51) and the corner-cube prism C, in accordance with the counted value input from the counter circuit 54. In connection with this, the controller 55 subtracts the counted value for the modulated reference light signal f6 from the counted value for the modulated return light signal f5 to correct an initial phase difference of the modulation signal f2.

Moreover, the controller 55 calculates the angle of an object to be measured with reference to the center of the total surveying station (identical to an intersection point of the axes of the shafts 4 and 6), based on the pulses generated from the horizontal encoder 9 and the vertical encoder 5. Namely, when the collimating telescopic portion 1 is made parallel with the horizontal reference surface of the body portion 2, the vertical encoder 5 inputs the reference pulse, which represents the origin of the altitude, to the controller 55, so that the origin of the altitude is set in the controller 55. Since each pulse input to the controller 55 from the vertical encoder 5 corresponds to a unit value of altitude, the controller 55 counts the number of pulses with reference to the origin of the altitude thus set, corrects the error detected by the inclination detector 58, and calculates the altitude of the collimating telescope in the horizontal direction. The origin of the azimuth is set by actuating a key of the operating portion 7 which is assigned the "0-set" function when the collimating telescope is oriented in an optionally selected direction (e.g., magnetic north). Since each pulse input to the controller 55 from the horizontal encoder 9 corresponds to a unit value of altitude, the controller 55 counts the number of pulses with reference to the origin of the azimuth thus set and calculates the azimuth of the collimating telescope with respect to the direction of the origin.

The controller 55 performs various data processing operations for the calculated object/angle data. The controller 55 as an indication mode switching means also controls the indication of the menu icon E in the indicating portion 8.

The generation of a buzzing sound by a buzzer 56 is controlled by the controller 55. The indicating portion 8 indicates the contents of the functions assigned to the function keys 7b, the distance and angle values calculated by the controller 55, the results of the data processing operation in accordance with a predetermined program, and other necessary information, etc., in the LCD panel 81. Details of the indicating portion 8 are shown in FIG. 3.

Figure 3:
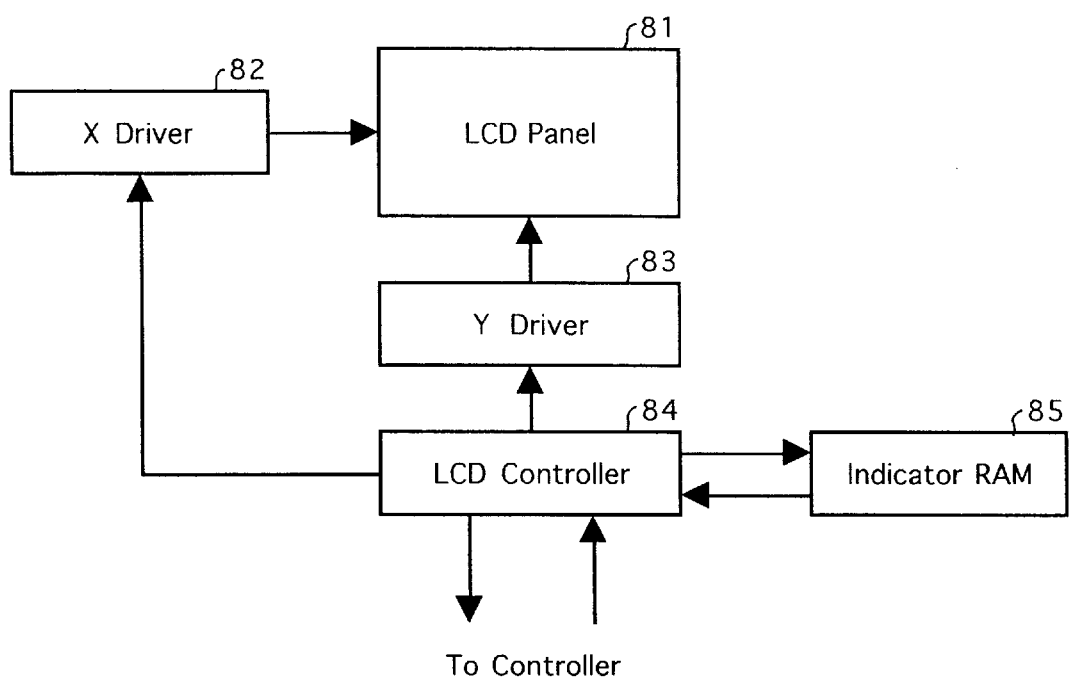
FIG. 3 is a block diagram of an internal structure of an indicator (display) shown in FIG. 2.

In FIG. 3, the LCD panel 81 is in the form of a matrix display made of TN (twisted nematic) liquid crystal. Namely, the LCD panel 81 is comprised of a glass substrate having a liquid crystal enclosed therein, a group of parallel electrodes (X electrodes) in the direction X formed on one surface (front surface) of the glass substrate, and a group of parallel electrodes (Y electrodes) in the direction Y perpendicular to the direction X, formed on the other surface (rear surface) of the glass substrate. When positive and negative voltages are applied to specific X and Y electrodes, respectively, the polarization direction of the liquid crystal molecules at the intersection of the specific X and Y electrodes is turned by 90°. to prevent light from passing therethrough. Since a reflecting plate and a back light are provided on the rear side of the LCD panel 81, a dark shadow is formed on the portion corresponding to the intersection through which no light can pass. Thus, each of the shadows, which are selectively formed on the intersections of the X and Y electrodes, constitutes a dot which is a fundamental unit of indication.

In order to indicate letters or symbols, etc., on the LCD panel, it is necessary to selectively produce light/dark portions by successively scanning each dot for an extremely short period (time pitch) with beams of light. To this end, the LCD panel 81 is connected to an X driver 82 and a Y driver 83. The X driver 82 applies a positive voltage or earth potential selectively to each of the X electrodes at a predetermined timing. The Y driver 83 applies a negative voltage or earth potential selectively to each of the Y electrodes at a predetermined timing.

An LCD controller 84 not only supplies timing data for the application of the voltage to the X and Y electrodes, to the X and Y drivers 82 and 83, respectively, but also synchronizes the operations of the X and Y drivers. The LCD controller 84 receives the data on the content of the indication from the controller 55 and writes the same in a RAM 85. The LCD controller 84 successively reads the stored data from the RAM 85 and controls the X driver 82 and the Y driver 83 so as to indicate the dots corresponding to the data on the LCD panel 81.

(Key Input Operation)

Figure 4:
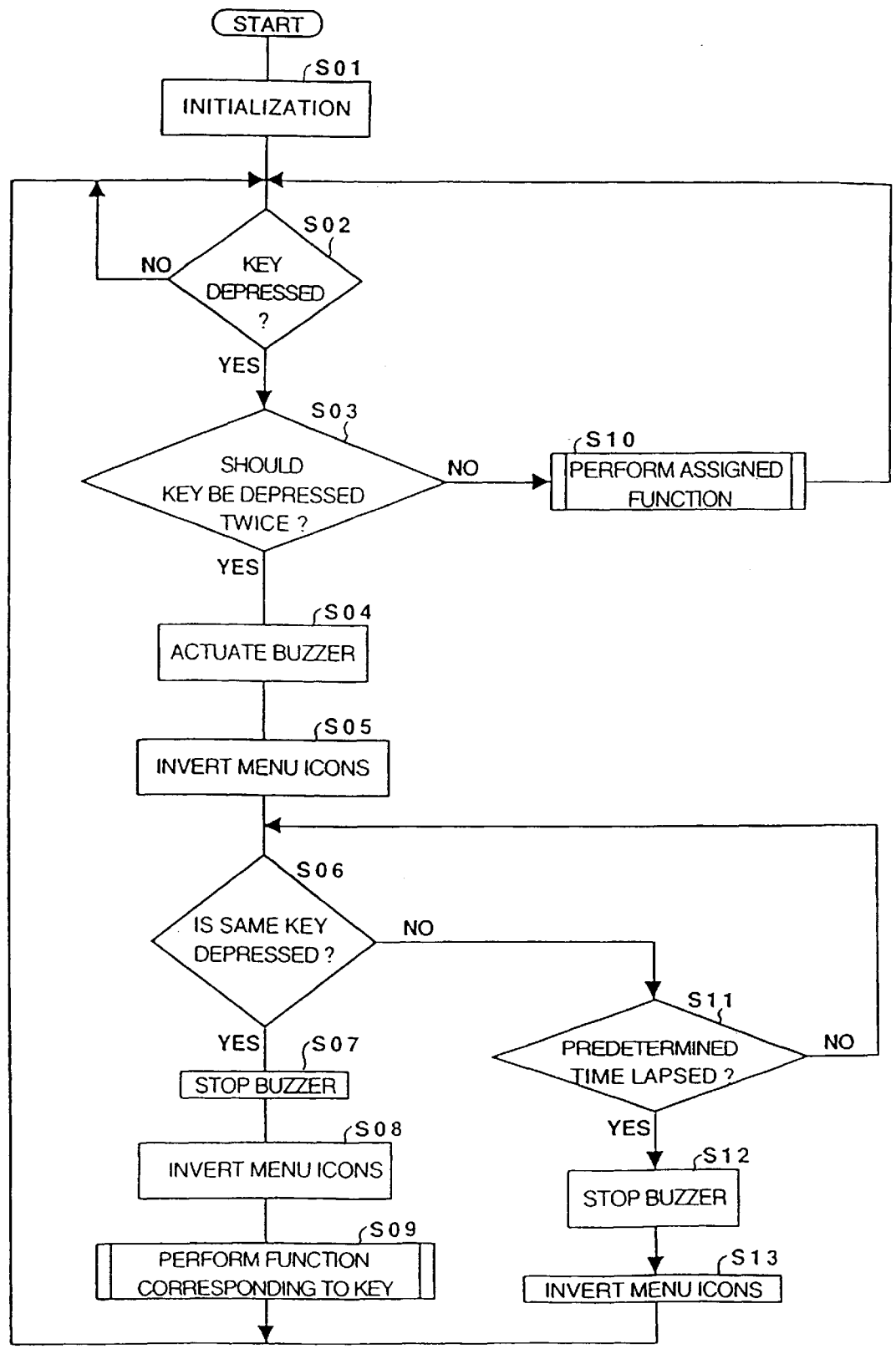
FIG. 4 is a flow chart of a distance indicating operation which is performed by a controller shown in FIG. 2.

The operation of the controller 55 when the input keys 7a and 7b of the operating portion 7 are actuated will be explained below, with reference to a flow chart shown in FIG. 4.

This flow chart starts when the total surveying station is supplied with electrical power. At step S01, initialization is carried out, namely, the total surveying station is set at the initialization mode, so that the functions corresponding to the initialization mode are assigned to the respective function keys. Furthermore, the menu icon E (corresponding to the function keys) which represents the functions assigned to the function keys 7b are indicated on the LCD panel 81 of the indicating portion 8, as indicated at (a) in FIGS. 5 and 6.

At step S02, whether or not any one of the keys is depressed is checked. If any key is depressed, the control proceeds to step S03 to check whether the depressed key is a key which is assigned a function that needs two depressions of the key.

If the key is a key which is not assigned a function that needs two depressions of the key at step S03, the control proceeds to step S10 at which the function assigned to the key is performed, e.g., mode changing. After mode changing is performed, a function is assigned to the function key 7b according to a changing mode. The menu icon E (corresponding to the function keys) which represents new functions assigned to the function keys 7b are indicated on the LCD panel 81. Thereafter, the control returns to step S02.

If at step S03 the key is a key which is assigned a function that needs two depressions of the key, the control proceeds to step S04 at which the buzzer 56 is activated to produce the buzzing sound. Thereafter, the indication in the menu icon E on the LCD panel 81 is inverted (corresponding to the indication mode switching means). The inversion of the indication in the menu icon E will be discussed below in more detail, referring to FIG. 5 by way of example.

Figure 5A:
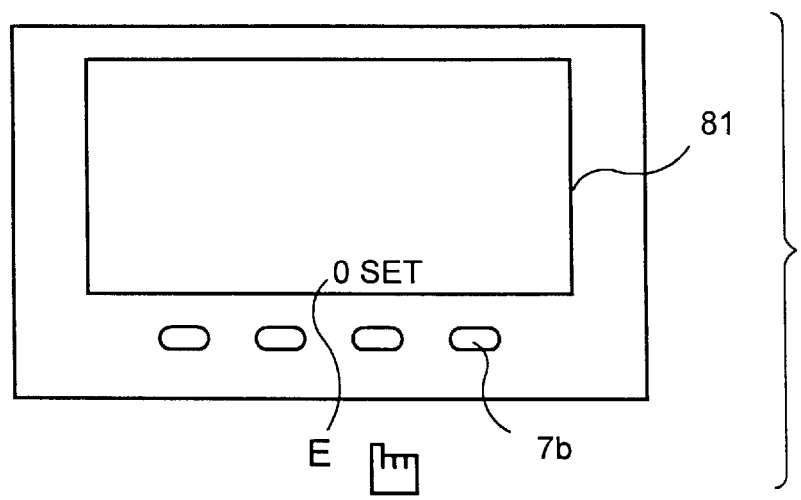
FIGS. 5a–5c is an explanatory view of an inverted indication of a "0-set" mode in a menu icon, by way of example; and, FIGS. 6a–6c is an explanatory view of an inverted indication of a "HOLD" mode in a menu icon, by way of example.

In FIG. 5a shows an indication in which the second function key 7b (from the right) is assigned the "0-set" function and no key is actuated. In this state, the menu icon E of the "0-set" is indicated by a black letter on a white background (first indication mode). The same is true for the menu icon E of the other function keys (that are assigned functions which are performed by a single depression of the associated keys). If the corresponding function key 7b is depressed once, the indication of a predetermined area including "0-set" (consisting of four letters) of the menu icon E is inverted, so that the "0-set" is indicated by white letters on a black background (second indication mode). Thus, the indication of the menu icon E is inverted.

At step S06, whether or not the same key (that is assigned a function which needs two depressions of the key) is depressed twice is checked. If no second depression of the same key is effected, the control proceeds to step S11 to check whether or not a predetermined time (e.g., 10 seconds)

has lapsed since the first depression of the key. If the predetermined time has not yet lapsed, the control is returned to step S06.

Figure 5B:
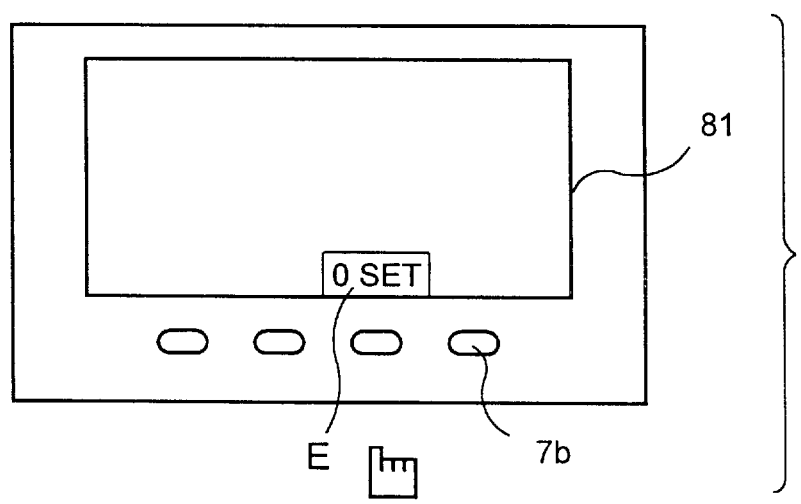
Figure 5C:
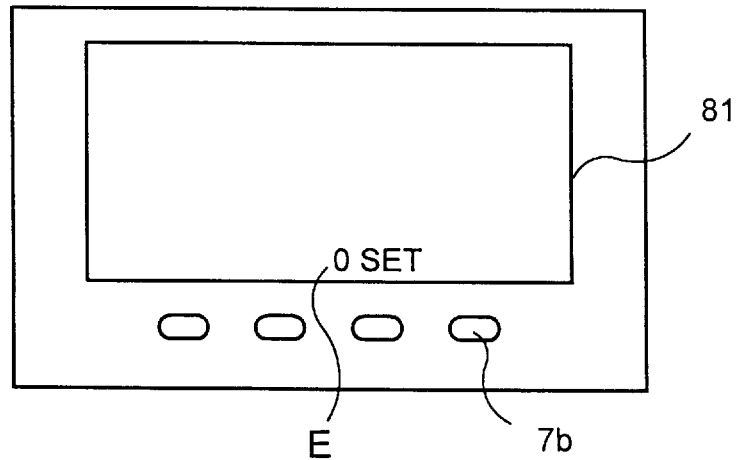

If the second depression of the same key occurs within the predetermined period of time, the control proceeds to step S07 to stop the buzzer 56. Thereafter, the indication of the menu icon E on the LCD panel 81 is inverted at step S08. Namely, the menu icon E is indicated by black letters on a white background, as shown in FIG. 5c, which is identical to FIG. 5a. Thereafter, at step S09, the function assigned to the associated key is performed (function performing means). For example, if the "0-set" function is assigned, as shown in FIGS. 5a–5c, the setting operation of the origin of the azimuth is effected. Alternatively, if the "HOLD" function is assigned as shown in FIGS. 6a–6c, the value of the azimuth indicated on the LCD panel 81 is held. If the operation at step S09 has completed, the control is returned to step S02 to prepare for a subsequent operation.

If at step S11 the predetermined time has lapsed without a second depression of the same key being effected, the control proceeds to step S12 to stop the buzzer 56. Thereafter, the indication of the menu icon E on the LCD panel 81 is inverted again and the control is returned to step S02.

When the distance and angle are measured using the total surveying station as constructed above, the operator first actuates the power switch to supply the electrical power to the total surveying station and inputs data necessary for initialization. Thereafter, the operator changes the operation mode to the angle measuring mode. Consequently, the "0-set" function is assigned to the second function key 7b from the right side (as viewed in FIGS. 5a–5c). Thus, the menu icon E of "0-set" is indicated on the LCD panel 81, as shown in FIG. 5a. Similarly, the third function key 7b from the right side (as viewed in FIGS. 6a–6c) is assigned the "HOLD" function, and consequently, the menu icon E of "HOLD" is indicated on the LCD panel 81, as shown in FIG. 6a.

The horizontal reference surface of the body portion 2 can be positioned to lie in the horizontal plane, for example, using a tripod or a level, etc., and the origin of the altitude can be set when the collimating telescopic portion 1 is oriented in the horizontal direction. The collimating telescope is oriented for example in the magnetic north direction by rotating the body portion 2. When the optical axis of the collimating telescope is identical to the magnetic north, the operator depresses the function key 7b once, which corresponds to "0-set" of the indicated menu icon E (steps S02, S03). Consequently, the buzzing sound is produced and the indication of "0-set" menu icon on the LCD panel 81 is inverted, as shown in FIG. 5b (steps S04, S05). Hence, the operator can immediately and visually recognize that two consecutive depressions of the function key (or predetermined pattern of depression) are needed to perform the function assigned to the depressed function key 7b, even if the total surveying station is used in a noisy environment or even if the operator suffers from hearing loss or a hearing impairment, etc.

Moreover, since the generation of the buzzing sound and the inverted indication of the menu icon continue within a predetermined time (e.g., 10 seconds), the operator can also recognize that a second depression of the same function key can still be executed (step S11). If the second depression of the same function key 7b is carried out by the operator within the predetermined time, the buzzer is stopped and the indication of the set menu icon E is inverted and the origin of the azimuth is set.

After the above preparatory operations are completed, the operator rotates the body portion 2 and the collimating telescopic portion 1 in horizontal and vertical planes, respectively to thereby adjust the line of sight with respect to the corner-cube prism C located at the point to be surveyed. The angular displacements in the horizontal and vertical directions are detected by counting the number of pulses issued from the encoders 5 and 9 by means of the controller 55, so that the altitude at the point to be surveyed and the azimuth with reference to the magnetic north can be calculated. The calculation results are indicated on the LCD panel 81.

When the operator inputs the instructions to measure the distance through the operating portion 7, the modulated light is emitted through the optical transmitting system L1 and the return light reflected from the corner-cube prism C is received by the surveying instrument through the light receiving system L2. The controller (computer) 55 calculates the range (distance) from the instrument to the corner-cube prism C, based on the phase difference between the modulated emission light and the return light and indicates the same on the LCD panel 81.

If the operator depresses the function key 7b once, corresponding to the indicated "HOLD" menu icon E, the buzzing sound is generated and the indication of the menu icon E is inverted, as shown in FIG. 6b. If the second depression of the same function key 7b by the operator takes place, it is indicated that the current azimuth is held, as shown in FIG. 6c. Consequently, the buzzer is stopped and the menu icon E is inverted again.

If the operator inputs data processing commands for the measurements, the controller 55 calculates necessary data, e.g., the altitude of the point to be surveyed with respect to the point at which the total station is located or the horizontal distance therebetween are obtained.

Note that although the LCD panel 81 is made of liquid crystal elements in a dot-matrix arrangement in the above mentioned embodiment, it can be constituted by a static drive type LCD having electrodes whose shape corresponds to the shape of the menu icon E. In this case, the menu icon E is flickered to encourage a second depression.

As can be understood from the above discussion, according to the present invention, for a key which must be actuated in accordance with a predetermined input pattern to perform the function assigned thereto, the indication mode corresponding to the associated key indicated by an indicating means varies, and hence, a need for a second operation of the key can be visually confirmed.

What is claimed is:

1. A surveying instrument comprising:

an operating portion having a number of keys including at least one specific key assigned to a specific function;

an indicating means for producing an indication corresponding to said specific key;

a first indication mode switching means for changing said indication from a first indication mode to a second indication mode upon said specific key being actuated once, the necessity for a second operation of said at least one specific key being visually indicated during a predetermined time limit;

a second indication mode switching means for changing said indication from said second indication mode to said first indication mode after said predetermined time limit has elapsed; and a function performing means for performing said specific function if said specific key is actuated a second time within said predetermined time limit;

wherein said indication mode changes from said second indication mode to said first indication mode upon said specific key being actuated a second time.

2. The surveying instrument according to claim 1, wherein one of said first and second indication mode switching means changes said indication mode from said second indication mode to said first indication mode when said function performing means commences performance of said specific function.

3. The surveying instrument according to claim 1, wherein said second indication mode is obtained by an inversion of said indication at said first indication mode.

4. The surveying instrument according to claim 1, wherein said second indication mode is obtained by flickering said indication at said first indication mode.

5. A surveying instrument comprising:

at least one key assigned to a specific function;

an indicating means for producing an indication corresponding to said key;

an indication mode switching means for switching said indication from a first indication mode to a second indication mode when said key is actuated once; and, a function performing means for performing said function only when said key is actuated a second time when said indicating means gives indication of said function at said second indication mode.

6. The surveying instrument according to claim 5, wherein said indication mode switching means changes said indication mode from said second indication mode to said first indication mode when a predetermined time has lapsed since said change from said first indication mode to said second indication mode.

7. The surveying instrument according to claim 5, wherein said indication mode switching means changes said indication mode from said second indication mode to said first indication mode when said function performing means commences performance of said specific function.

8. The surveying instrument according to claim 5, wherein said second indication mode is obtained by an inversion of said indication at said first indication mode.

9. The surveying instrument according to claim 5, wherein said second indication mode is obtained by flickering said indication at said first indication mode.

10. The surveying instrument according to claim 5, further comprising a buzzer which actuates when said key is actuated once.

11. The surveying instrument according to claim 10, wherein said first indication mode switches to said second indication mode after said buzzer has been actuated.

12. The surveying instrument according to claim 11, wherein when said key is actuated again during said indication at said second indication mode said buzzer is stopped.

13. The surveying instrument according to claim 11, wherein when a predetermined time has lapsed since said change from said first indication mode to said second indication mode and said key has not been actuated again during said predetermined time, said buzzer is stopped.

* * * * *